(12) United States Patent
Kanda et al.

(10) Patent No.: US 9,543,228 B2
(45) Date of Patent: Jan. 10, 2017

(54) SEMICONDUCTOR DEVICE, SEMICONDUCTOR INTEGRATED CIRCUIT DEVICE, AND ELECTRONIC DEVICE

(71) Applicants: FUJITSU LIMITED, Kawasaki-shi, Kanagawa (JP); FUJITSU SEMICONDUCTOR LIMITED, Yokohama-shi, Kanagawa (JP)

(72) Inventors: Kouichi Kanda, Eindhoven (NL); Nobumasa Hasegawa, Kawasaki (JP)

(73) Assignees: FUJITSU LIMITED, Kawasaki (JP); FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/078,623

(22) Filed: Nov. 13, 2013

(65) Prior Publication Data

US 2014/0131860 A1    May 15, 2014

(30) Foreign Application Priority Data

Nov. 13, 2012  (JP) .................................. 2012-249538

(51) Int. Cl.
*H01L 23/367* (2006.01)
*H01L 23/48* (2006.01)
(Continued)

(52) U.S. Cl.
CPC ......... *H01L 23/481* (2013.01); *H01L 23/3677* (2013.01); *H01L 23/4824* (2013.01);
(Continued)

(58) Field of Classification Search
CPC .............. H01L 29/7833; H01L 23/481; H01L 23/3677; H01L 23/522; H01L 29/7835; H01L 24/06; H01L 23/485; H01L 23/585;
H01L 21/4871; H01L 23/36; H01L 23/49568; H01L 45/1286; H01L 2023/4043; H01L 23/4824
See application file for complete search history.

(56) References Cited

U.S. PATENT DOCUMENTS 6,242,807 B1 * 6/2001 Kazami ......................... 257/758
6,525,419 B1 * 2/2003 Deeter .................. H01L 23/367
257/625

(Continued)

FOREIGN PATENT DOCUMENTS

JP      2004-282000      10/2004
JP      2006-190839       7/2006
(Continued)

OTHER PUBLICATIONS

Patent Abstracts of Japan, Publication No. 2010-267944, Published Nov. 25, 2010.
(Continued)

*Primary Examiner* — Jarrett Stark
*Assistant Examiner* — Bitew Dinke
(74) *Attorney, Agent, or Firm* — Staas & Halsey LLP

(57) ABSTRACT

A semiconductor device includes a semiconductor substrate; an active element configured to be formed on the semiconductor substrate; and a multi-layer wiring structure configured to be formed on the semiconductor substrate. A heat dissipation structure is provided in the multi-layer wiring structure. The upper end of the heat dissipation structure forms an external connection pad to be connected with an external wiring board, and the lower end of the heat dissipation structure makes contact with a surface of the semiconductor substrate outside of an element forming region for the active element.

19 Claims, 12 Drawing Sheets

(51) Int. Cl.
  *H01L 23/482* (2006.01)
  *H01L 23/522* (2006.01)
  *H01L 29/78* (2006.01)
  *H01L 23/00* (2006.01)

(52) U.S. Cl.
  CPC ............ *H01L 23/522* (2013.01); *H01L 24/06* (2013.01); *H01L 29/7833* (2013.01); *H01L 29/7835* (2013.01); *H01L 24/05* (2013.01); *H01L 24/13* (2013.01); *H01L 24/16* (2013.01); *H01L 2224/0401* (2013.01); *H01L 2224/05567* (2013.01); *H01L 2224/06519* (2013.01); *H01L 2224/131* (2013.01); *H01L 2224/16225* (2013.01); *H01L 2924/00014* (2013.01); *H01L 2924/13091* (2013.01)

(56) References Cited

U.S. PATENT DOCUMENTS

| | | | | |
|---|---|---|---|---|
| 6,898,096 | B2* | 5/2005 | Endo et al. | 363/147 |
| 7,135,766 | B1* | 11/2006 | Costa et al. | 257/700 |
| 7,235,864 | B2* | 6/2007 | Lee | 257/620 |
| 8,513,778 | B2* | 8/2013 | Tokitoh | 257/621 |
| 2004/0164418 | A1 | 8/2004 | Sugiura et al. | |
| 2006/0145347 | A1 | 7/2006 | Aida | |
| 2006/0255468 | A1* | 11/2006 | Kim | H01L 23/367 257/773 |
| 2007/0215907 | A1 | 9/2007 | Krimmer et al. | |
| 2007/0228476 | A1* | 10/2007 | Okushima | 257/355 |
| 2009/0008750 | A1* | 1/2009 | Tokitoh | H01L 23/562 257/629 |
| 2009/0045487 | A1* | 2/2009 | Jung | 257/621 |
| 2010/0109052 | A1* | 5/2010 | Nakajima et al. | 257/197 |
| 2011/0073900 | A1 | 3/2011 | Sugizaki | |
| 2011/0176278 | A1* | 7/2011 | Park et al. | 361/712 |
| 2012/0132964 | A1* | 5/2012 | Shima | H01L 23/4824 257/211 |
| 2012/0146186 | A1* | 6/2012 | Lukaitis | H01L 23/3677 257/536 |
| 2012/0153358 | A1* | 6/2012 | Shankar et al. | 257/213 |

FOREIGN PATENT DOCUMENTS

| | | |
|---|---|---|
| JP | 2007-67409 | 3/2007 |
| JP | 2010-267944 | 11/2010 |
| JP | 2011-71274 | 4/2011 |
| JP | 2012-119469 | 6/2012 |

OTHER PUBLICATIONS

Patent Abstracts of Japan, Publication No. 2011-071274, Published Apr. 7, 2011.
Patent Abstracts of Japan, Publication No. 2004-282000, Published Oct. 7, 2004.
Patent Abstracts of Japan, Publication No. 2006-190839, Published Jul. 20, 2006.
Patent Abstracts of Japan, Publication No. 2007-67409, Published Mar. 15, 2007.
Patent Abstracts of Japan, Publication No. 2012-119469, Published Jun. 21, 2012.
Japanese Office Action dated Aug. 23, 2016 in corresponding Japanese Patent Application No. 2012-249538.

* cited by examiner

AA: AMP ARRAY

SEMICONDUCTOR DEVICE, SEMICONDUCTOR INTEGRATED CIRCUIT DEVICE, AND ELECTRONIC DEVICE

CROSS-REFERENCE TO RELATED APPLICATIONS

This application is based upon and claims the benefit of priority of the prior Japanese Priority Application No. 2012-249538 filed on Nov. 13, 2012, the entire contents of which are hereby incorporated by reference.

FIELD

The disclosures herein generally relate to a semiconductor device.

BACKGROUND

High-power semiconductors are used for power amplifiers that constitute output-stage circuits in various wireless devices including, for example, cellular phones. Also, a large-scale integrated circuit device constituting a high-performance processor such as a supercomputer may be viewed as one of high-power semiconductors from the standpoint of high power consumption. In the following description, such a large-scale integrated circuit that consumes high power is considered to be a high-power semiconductor circuit.

RELATED-ART DOCUMENTS

Patent Documents

[Patent Document 1] Japanese Laid-open Patent Publication No. 2010-267944
[Patent Document 2] Japanese Laid-open Patent Publication No. 2011-71274
[Patent Document 3] Japanese Laid-open Patent Publication No. 2004-282000

An efficient heat dissipation structure has been desired for such a high-power semiconductor because heat is generated intensively during an operation of the device. For example, in case of a so-called "discrete high-power semiconductor" used for an output-stage circuit in a wireless device such as a cellular phone, a configuration is often adopted in that the semiconductor chip is mounted on a wiring board with face-up mounting so that heat is dissipated from the back side of the semiconductor chip, and electrical connections are established by wire bonding. However, there is a problem with such a wire bonding configuration that occupies a large area on a wiring board, which increases the size of a wireless device.

On the other hand, in various electronic devices, flip-chip mounting is used for mounting semiconductor chips and parts on a wiring board, which is a technology that makes the occupied area small, and reduces parasitic inductance and parasitic resistance. The flip-chip mounting technology is also desired for wireless electronic devices to mount high-power semiconductors on a wiring board along with semiconductor chips and parts constituting a peripheral circuit.

Also, it has been considered to integrate such a high-power semiconductor device into a semiconductor integrated circuit device with semiconductor elements constituting a peripheral circuit. It is common to use the flip-chip mounting technology for a semiconductor integrated circuit device to connect a number of contact pads electrically. For example, in a large-scale integrated circuit device used for a high-speed processing element, the flip-chip mounting technology is widely used.

Using the flip-chip mounting technology, a semiconductor chip is connected electrically, mechanically and thermally with a wiring board, which also serves as a heatsink, with a considerable but limited number of bumps. Therefore, if flip-chip mounting is applied to a high-power semiconductor chip constituting a high-power semiconductor device, a problem arises in that only a limited number of heat conducting paths are available for dissipating heat generated by the high-power semiconductor chip. Under such circumstances, it has been desired to realize efficient heat dissipation for a high-power semiconductor device built in a flip-chip mounting configuration.

SUMMARY

According to an embodiment of the present invention, a semiconductor device includes a semiconductor substrate; an active element configured to be formed on the semiconductor substrate; and a multi-layer wiring structure configured to be formed on the semiconductor substrate. A heat dissipation structure is provided in the multi-layer wiring structure. The upper end of the heat dissipation structure forms an external connection pad to be connected with an external wiring board, and the lower end of the heat dissipation structure makes contact with a surface of the semiconductor substrate outside of an element forming region for the active element.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

First Embodiment

Figure 1:
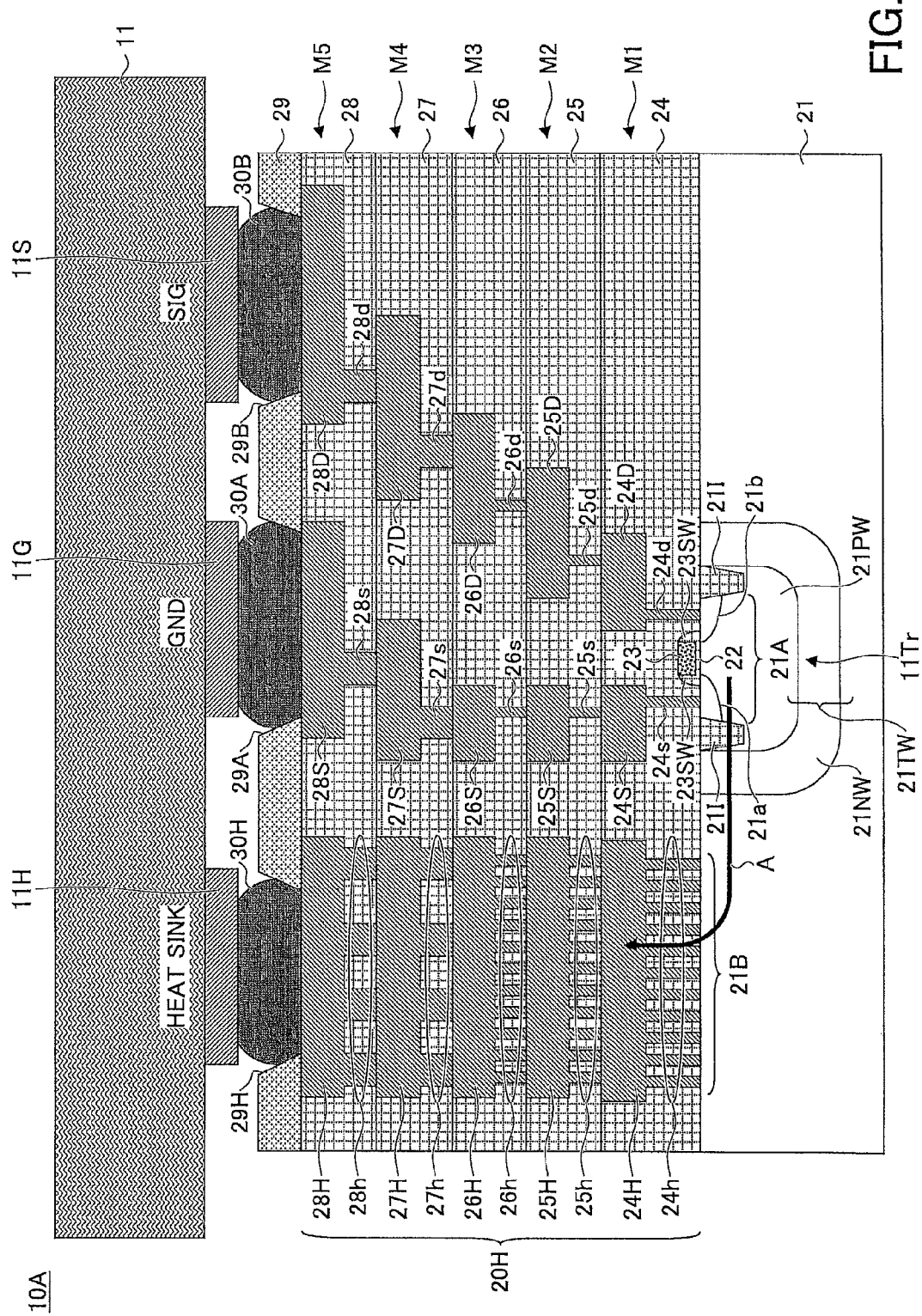
FIG. 1 is a cross-sectional view illustrating a configuration of an electronic device according to a first embodiment.

FIG. 1 is a cross-sectional view illustrating a configuration of an electronic device 10A according to a first embodiment.

In the illustrated example, the electronic device 10A constitutes a high-power output circuit that operates in a GHz band, which is used for a final output-stage in a cellular phone, and includes a wiring board 11 and a semiconductor chip 21 that is flip-chip mounted on a wiring board 11.

Referring to FIG. 1, the semiconductor chip 21 is, for example, built on a p-type silicon substrate that has a triple well structure 21TW formed by an outer n-type well 21NW and an inner p-type well 21PW, which includes an element forming region 21A formed from p-type silicon separated from the vicinity by an STI-type element isolating region 21I. On the semiconductor chip 21, a gate electrode 23 formed from, for example, an n+ type polysilicon, which is formed above the element forming region 21A via a gate insulation film 22 formed from, for example, a silicon dioxide film.

The gate electrode 23 has side insulation films 23SW formed on both sides of it that is silicon dioxide films or silicon nitride films. In the element forming region 21A in the semiconductor chip 21, an n+ type source region 21a and an n+ type drain region 21b are formed at both sides of the gate electrode 23, respectively. The polysilicon gate electrode 23, the gate insulation film 22, the source region 21a, and the drain region 21b constitute a MOS transistor that is an active element in the element forming region 21A.

On the semiconductor chip 21, an interlayer insulating film 24 formed from, for example, a silicon dioxide film, is formed covering the gate electrode 23, and on the interlayer insulating film 24, interlayer insulating films 25-28 are formed one after another. The interlayer insulating films 24-28 include wiring layers M1-M5, respectively, which form a multi-layer wiring structure on the semiconductor chip 21.

In the present embodiment, the gate electrode 23 has the gate width of 10 mm and the gate length of 130 μm as a whole, and the gate insulation film 22 is formed from a silicon thermal oxide film, and is formed to have the film thickness of, for example, 4 nm. In this case, the gate electrode 23, the gate insulation film 22, the source region 21a, and the drain region 21b form a high-power transistor 11Tr that is able to output about 1W of power in a GHz band. However, usage of the transistor 11Tr in the present embodiment, which is formed with the gate electrode 23, the gate insulation film 22, the source region 21a, and the drain region 21b, is not limited to such a high-power transistor that operates in a GHz band or a high-frequency band, but may be used, for example, as a super-fast transistor whose gate length is below 45 nm, which constitutes a super-fast processing element. In this case, the gate insulation film 22 is formed from, for example, a SiON film having the film thickness of about 1 nm, and the interlayer insulating films 24-28 that constitute the multi-layer wiring structure are formed from what is called Low-K films.

If the transistor 11Tr is formed to be a high-power transistor, instead of a single transistor having the gate width of 10 mm, two adjacent transistors having the gate width of 5 mm or four adjacent transistors having the gate width of 2.5 mm may be formed and connected with each other in parallel on the semiconductor chip 21.

Referring to FIG. 1 again, the interlayer insulating film 24 includes a source wiring pattern 24S that is electrically connected with the source region 21a through a via plug 24s, and a drain wiring pattern 24D that is electrically connected with the drain region 21b through a via plug 24d as a part of the wiring layer M1. The interlayer insulating film 25 includes a source wiring pattern 25S that is electrically connected with the source wiring pattern 24S through a via plug 25s, and a drain wiring pattern 25D that is electrically connected with the drain wiring pattern 24D through a via plug 25d as a part of the wiring layer M2. Also, the interlayer insulating film 26 includes a source wiring pattern 26S that is electrically connected with the source wiring pattern 25S through a via plug 26s, and a drain wiring pattern 26D that is electrically connected with the drain wiring pattern 25D through a via plug 26d as a part of the wiring layer M3. The interlayer insulating film 27 includes a source wiring pattern 27S that is electrically connected with the source wiring pattern 26S through a via plug 27s, and a drain wiring pattern 27D that is electrically connected with the drain wiring pattern 26D through a via plug 27d as a part of the wiring layer M4. Moreover, the interlayer insulating film 28 includes a source wiring pattern 28S that is electrically connected with the source wiring pattern 27S through a via plug 28s, and a drain wiring pattern 28D that is electrically connected with the drain wiring pattern 27D through a via plug 28d as a part of the wiring layer M5.

On the interlayer insulating film 28 at the uppermost layer, a passivation film 29 is formed from a polyimide film or a silicon nitride film. The passivation film 29 has openings 29A-29B for exposing a source connection pad 28S and a drain connection pad 28D, respectively. The source connection pad 28S and the drain connection pad 28D are electrically and mechanically connected with a ground wiring pattern 11G and a signal wiring pattern 11S on the wiring board 11 via solder bumps 30A-30B formed on the openings 29A-29B, respectively. In the illustrated example, the source wiring patterns 24S, 25S, 26S, and 27S, the source connection pad 28S, and their respective via plugs 24s-28s are made of copper (Cu) and formed by a dual damascene method. Similarly, the drain wiring patterns 24D, 25D, 26D, and 27D, the drain connection pad 28D, and their respective via plugs 24d-28d are made of copper (Cu) and formed by the dual damascene method. Therefore, the source wiring patterns 24S, 25S, 26S, and 27S, the source connection pad 28S, the drain wiring patterns 24D, 25D, 26D, and 27D, and the drain connection pad 28D have a feature in their forms in that their respective upper surfaces are substantially coincident with the corresponding upper surfaces of the interlayer insulating films 24-28.

The wiring patterns 24S-26S and 24D-26D, and the via plugs 24s-26s and 24d-26d, which are formed in the interlayer insulating films that are at comparatively lower layers in the multi-layer wiring structure, namely, the interlayer insulating films 24-26, are formed with stricter design rules than the wiring pattern 27S-28S and 27D-28D and the via plugs 27s-28s and 27d-28d that are formed at upper layers of the interlayer insulating films, namely, the interlayer insulating films 27-28.

Additionally formed in the electronic device 10A in FIG. 1 are heat dissipation pads 24H, 25H, 26H, 27H, and 28H made of Cu in the interlayer insulating films 24-28 as a part of the wiring layers M1-M5, respectively, which are formed by the dual damascene method along with Cu-made via plugs 24h-28h extending downwards from the Cu-made heat dissipation pads 24H-28H, formed above a heat dissipation region 21B outside of the triple well 21TW in the semiconductor chip 21. Namely, the Cu pad 24H is formed with the Cu via plugs 24h extending downwards, and the Cu pad 25H is formed with the Cu via plugs 25h extending downwards. The Cu pad 26H is formed with the Cu via plugs 26h extending downwards, and the Cu pad 27H is formed with the Cu via plugs 27h extending downwards. Moreover, the Cu pad 28H is formed with the Cu via plugs 28h extending downwards. As described earlier, the Cu pads 24H-28H are formed by the dual damascene method along with Cu via plugs 24h-28h extending downwards, the Cu pads 24H-28H also have the feature in their forms that their respective upper surfaces are substantially coincident with the corresponding upper surfaces of the interlayer insulating films 24-28.

The Cu via plugs 28h make contact with the surface of the Cu pad 27H below, and the Cu via plugs 27h make contact with the surface of the Cu pad 26 below. The Cu via plugs 26h make contact with the surface of the Cu pad 25H below, and the Cu via plugs 25h make contact with the surface of the Cu pad 24 below. Moreover, the Cu via plugs 24h make contact with the surface of the semiconductor chip 21 below. In this way, in the configuration in FIG. 1, a heat dissipation structure 20H is formed that directly makes contact with the semiconductor chip 21 on the heat dissipation region 21B, above which the via plugs 24h, pad 24H, via plugs 25h, pad 25H, via plugs 26h, pad 26H, via plugs 27h, pad 27H, via plugs 28h, and pad 28H made of Cu are formed in this order, up to the uppermost layer, or the interlayer insulating film 28.

Moreover, an opening 29H is formed in the passivation film 29 on the Cu pad 28H in the uppermost layer, through which the pad 28H is connected with a conductor pattern 11H on the wiring board 11 via a solder bump 30H. Here, the conductor pattern 11H and the wiring board 11 function as a heatsink that conducts heat generated at the transistor 11Tr through the semiconductor chip 21, the heat dissipation structure 20H, the solder bump 30H, and the conductor pattern 11H on the wiring board 11. The semiconductor chip 21 has a superior thermal conductivity of 149 $W \cdot m^{-1} \cdot K^{-1}$ at 300 K that conducts heat generated at the transistor 11Tr through the semiconductor chip 21 and heat dissipation structure 20H as designated by an arrow A in FIG. 1. Cu used as the material of the heat dissipation structure 20H has a greater thermal conductivity than silicon, 401 $W \cdot m^{-1} \cdot K^{-1}$ at 300 K. Also, via plugs 24h-28h constituting the heat dissipation structure are densely arrayed in the interlayer insulating films 24-28 in a matrix shape in plan view. Therefore, heat dissipation is not hindered by thermal resistance of the heat dissipation structure 20H. In the present embodiment, the via plugs 24h-28h occupy 50%-60% of the area of the corresponding pads in plan view in the interlayer insulating films 24-28, respectively. However, the relationship between the pad and the via plugs with respect to the occupied area in plan view is not limited to the above value.

Moreover, in the heat dissipation structure 20H in FIG. 1, it should be noted that the pads 24H, 25H, 26H, 27H, and 28H are lined up in the direction vertical to the principal surface of the semiconductor chip 21, and the respective via plugs are formed to connect the upper and lower pads with each other in the direction vertical to the principal surface. Configured in this way, the heat dissipation structure 20H can conduct heat generated at the transistor 11Tr to the conductor pattern 11H with the shortest distance, with which the thermal resistance of the heat dissipation structure 20H is further reduced.

Thus, according to the present embodiment, the electronic device 10A can perform efficient heat dissipation even though implemented with flip-chip mounting, by forming the heat dissipation structure 20H that directly makes contact with the surface of the semiconductor chip 21.

Moreover, in the configuration in FIG. 1, the conductor pattern 11H on the wiring board 11 is electrically grounded by being connected with the semiconductor chip 21 whose potential is the ground potential. This path to the ground is provided separately from the ground pattern 11G adjacent to it. Thus, by adopting the configuration that separates the heat dissipation path of the conductor pattern 11H from the ground pattern 11G that is a part of a signal transmission system, it is possible to prevent noise in the semiconductor chip 21 from mixing into the signal transmission system.

Figure 2:
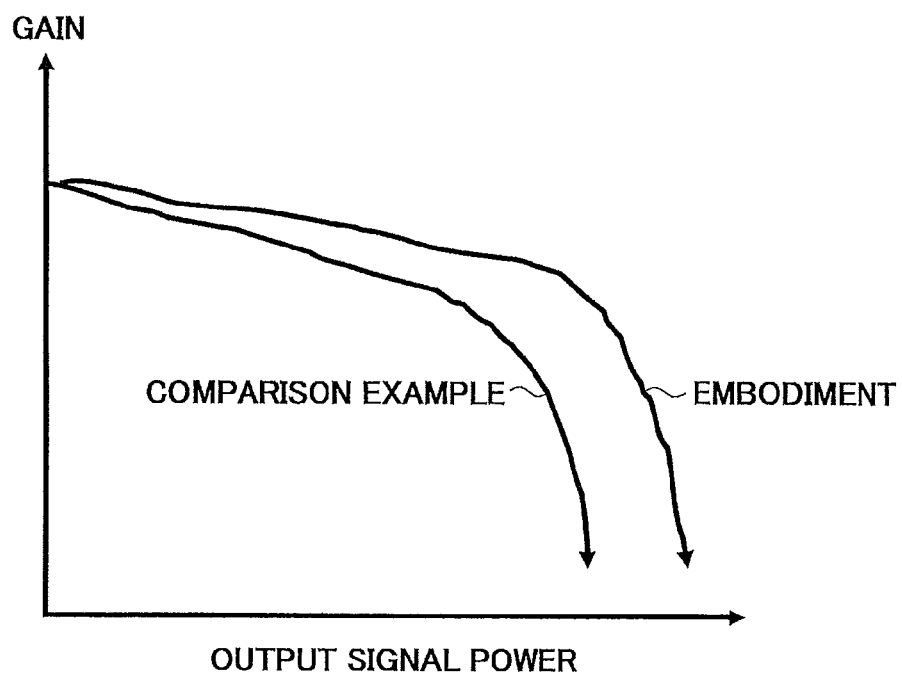
FIG. 2 is a graph illustrating a relationship between gain and output signal electric power of the electronic device in FIG. 1 by comparing with a comparison example.
Figure 3:
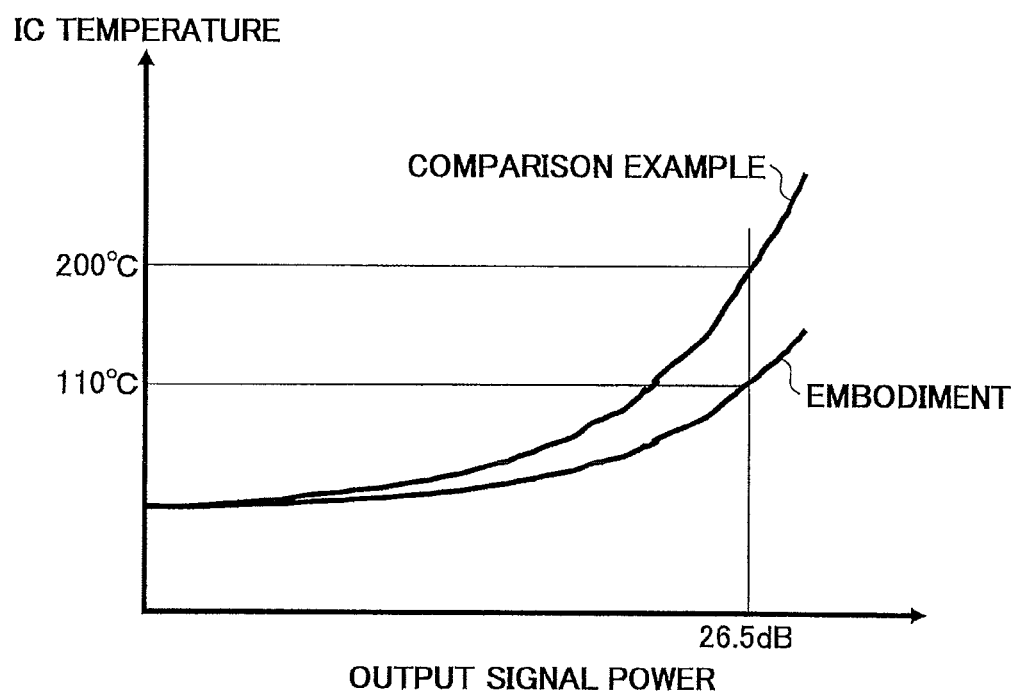
FIG. 3 is a graph illustrating a relationship between chip temperature and output signal electric power of the electronic device in FIG. 1 by comparing with the comparison example.

FIGS. 2-3 are graphs illustrating output characteristics and heat dissipation characteristics, respectively, when using the electronic device 10A in FIG. 1 as an amplifier in a GHz band, compared with an electronic device 110 in a comparison example. In FIGS. 2-3, an "embodiment" designates the electronic device 10A in FIG. 1, a "comparison example" designates the electronic device 110 in FIG. 4.

Figure 4:
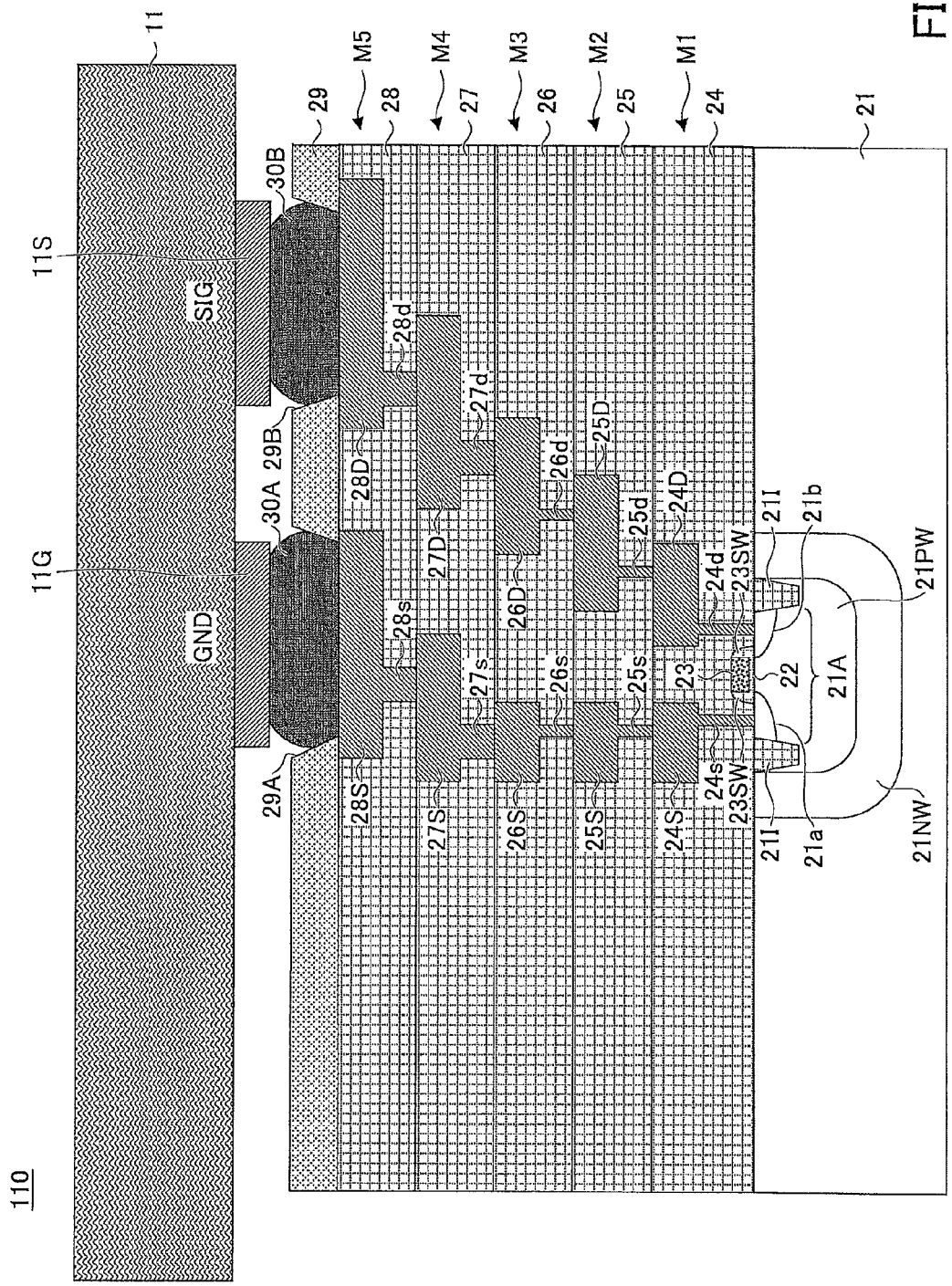
FIG. 4 is a cross-sectional view illustrating a configuration of an electronic device according to the comparison example.

First, referring to FIG. 4, the electronic device 110 in the comparison example has a similar configuration to that of the electronic device 10A in FIG. 1, but has a difference that the heat dissipation structure 20H is omitted. In FIG. 4, corresponding numerical codes are assigned to the parts described earlier, and their description is omitted.

In FIG. 2, the vertical axis represents gain of the amplifier, and the horizontal axis represents electric power of an obtained output signal.

Referring to FIG. 2, comparing the same gain, the electronic device 10A according to the present embodiment can achieve greater output of electric power, and the difference between the two is further magnified when increasing the output signal electric power.

Also, in FIG. 3, the vertical axis represents the temperature (IC temperature) of a silicon chip constituting the electronic device 10A, and the horizontal axis represents electric power of an obtained output signal.

Referring to FIG. 3, the chip temperature of the comparison example rises rapidly when the output signal electric power increases, whereas the temperature of the electronic device 10A provided with the heat dissipation structure 20H according to the present embodiment in FIG. 1 rises slower, and the difference between the two is further magnified when increasing the output signal electric power, although when the heat dissipation structure 20H is omitted, the electronic device 10A in FIG. 1 shows a rapid IC temperature rise when the output signal electric power increases. For example, in case of an output signal electric power of 26.5 dB, the temperature of the silicon chip reaches 200° C. with the comparison example, whereas the temperature of the silicon chip is suppressed to 110° C. with the electronic device 10A according to the present embodiment.

Thus, according to the present embodiment, the electronic device 10A in FIG. 1 can efficiently dissipate heat generated in the transistor 11Tr out of the system, namely, out of the semiconductor chip 21, by forming the heat dissipation structure 20H that directly makes contact with the surface of the semiconductor chip 21.

Figure 5B:
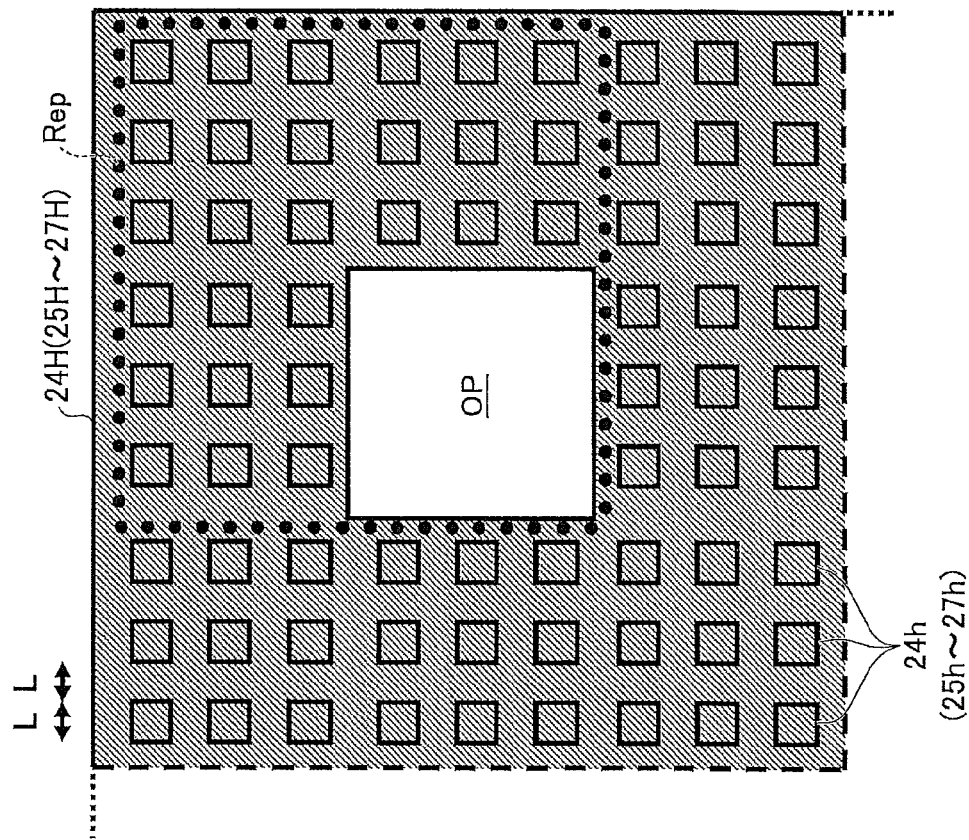
FIGS. 5A-5B are plan views illustrating a heat dissipation structure used in the embodiment in FIG. 1.
Figure 5A:
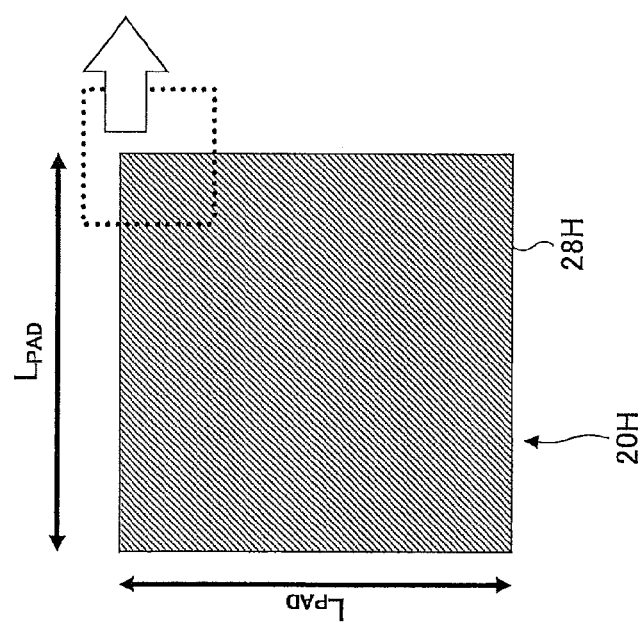

FIG. 5A is a plan view of the heat dissipation structure 20H in FIG. 1, and FIG. 5B is a plan view of the Cu pad 24H and the via plugs 24h extending downwards from the Cu pad 24, which are taken as an example of the Cu pads including 24H-27H except for the uppermost 28H in the heat dissipation structure 20H. FIG. 5B is an enlarged view of a part surrounded by a dashed line in FIG. 5A.

Referring to FIG. 5A, the plan view illustrates only the Cu pad 28H on the uppermost layer, and the underlying Cu pads cannot be seen. This is because in the embodiment in FIG. 1, the Cu pad 28H at the uppermost layer and the underlying Cu pads 24H-27H have the same dimension and form, and they are lined up in the direction vertical to the principal surface of the silicon substrate 21. In the illustrated example, the Cu pads 24H-28H are formed in a square shape with the side length $L_{PAD}$, for example, 100 μm. However, in the present embodiment, the Cu pads 24H-28H do not necessarily have the square form of the same dimension, but dimensions and size may be changed for the respective interlayer insulating films as long as thermal resistance does not increase and degrees of freedom for other wirings in the multi-layer wiring structure are not disturbed, for example, for signal wiring, power source wiring, and the like.

Referring to FIG. 5B, in the Cu pads 24H-27H other than the Cu pad 28H at the uppermost layer via plugs are repeatedly formed in a matrix shape with the pitch of a constant length L, and each of the via plugs has a square cross-sectional view with the side length L. The length and pitch L is set, for example, to 2 μm for the Cu via plugs 24h-26h at the lower-layers, and set to a larger value such as 4 μm (2×) or 8 μm (4×) for the Cu via plugs 27h-28h at the upper-layers.

Moreover, a large opening OP is formed at the center portion of the Cu pad except for the uppermost layer, as illustrated in the plan view in FIG. 5B, whose side length is, for example, about 12 μm. The opening OP is filled with the material that forms the corresponding interlayer insulating film, for example, a silicon dioxide film for the interlayer insulating film 24. A part Rep surrounded by a thick dotted line in the plan view in FIG. 5B is repeatedly formed on the whole area of the Cu pad 24H, and consequently, the openings OP are repeatedly formed on the whole area of the Cu pad 24H. This is the same for the Cu pads 25H-27H.

By repeatedly and uniformly forming the openings OP filled with the silicon dioxide film in the large area of the Cu pads, dishing can be suppressed that is likely to happen in a chemical mechanical polishing (CMP) process when forming the Cu pads 24H-27H and the via plugs 24h-27h with a damascene method or a dual damascene method, which makes it possible to realize secure mechanical and thermal connections between a pad and via plugs, for example, between the Cu pad 24H and the via plugs 25h extending downwards from the upper Cu pad 25H. When using openings to suppress such dishing, if an opening OP in a Cu pad is too large, it increases thermal resistance of the heat dissipation structure 20H, or if too small, it induces dishing that also increases thermal resistance. Therefore, the dimension of a side of the opening OP may be set to about 1 μm at the lower layers, and set to about 15 μm at the upper layers, which are changed depending on levels of layers. Also to minimize thermal resistance of the heat dissipation structure 20H, it is desirable to form the Cu pads 24H-27H so that the openings OP, which are thermal resistors, are lined up in the direction vertical to the principal surface of the semiconductor chip 21 in the heat dissipation structure 20H. In the Cu pad 28H at the uppermost layer, the via plugs 28h are formed over the entire surface.

Figure 6:
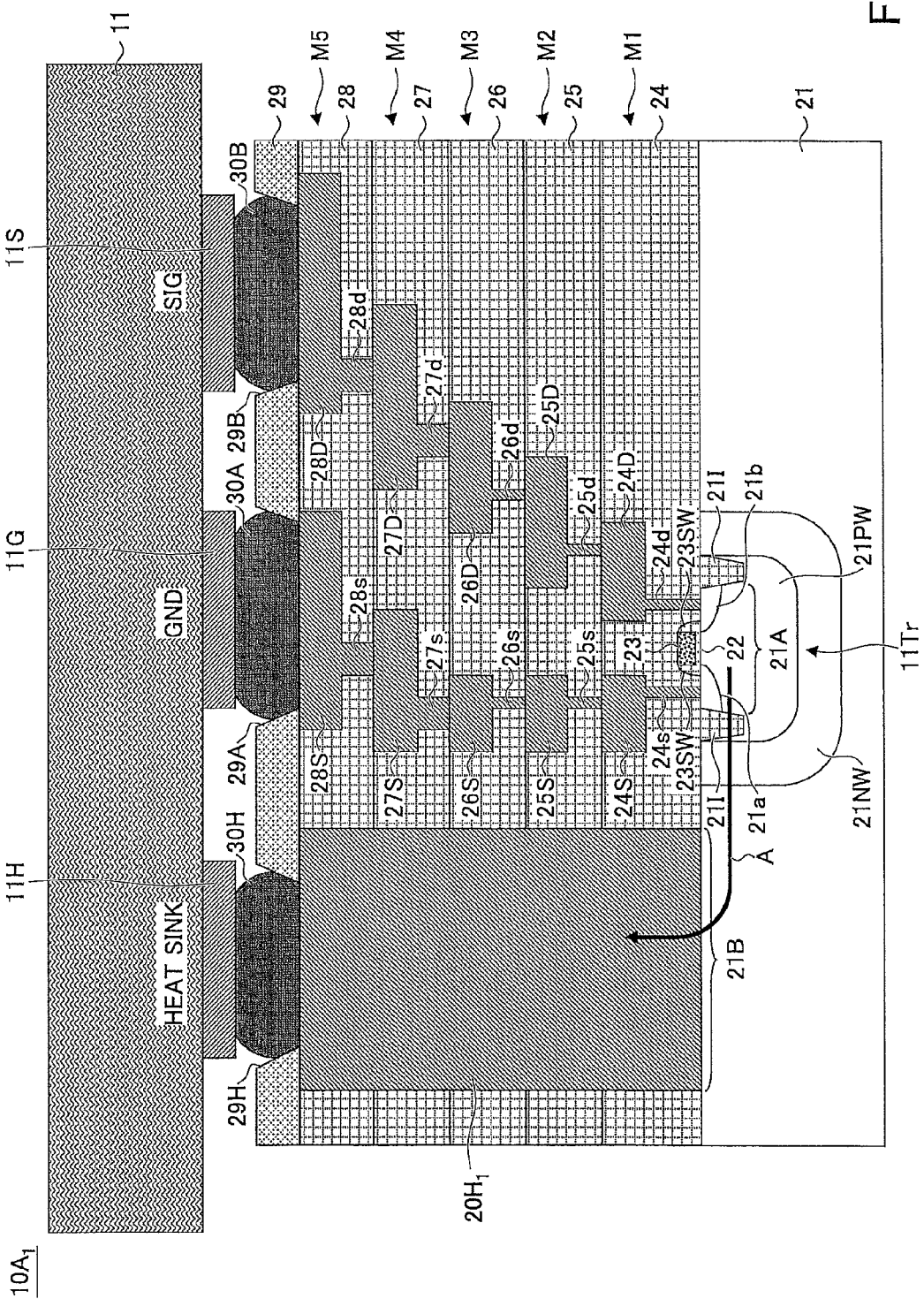
FIG. 6 is a cross-sectional view illustrating a configuration of an electronic device according to a modified example of the electronic device in FIG. 1.

FIG. 6 is a cross-sectional view illustrating a configuration of an electronic device $10A_1$ according to a modified example of the electronic device 10A in FIG. 1. In FIG. 6, the same numerical codes are assigned to the parts described earlier, and their description is omitted.

Referring to FIG. 6, in the modified example, instead of the heat dissipation structure 20H in the electronic device 10A formed with the multi-layer wiring structure, a heat dissipation structure $20H_1$ is a single metal pillar formed between the semiconductor chip 21 and the solder bump 30H, whose lower surface directly makes contact with the surface of the silicon substrate constituting the semiconductor chip 21, and whose upper surface directly makes contact with the solder bump 30H.

With this configuration, a heat dissipation path designated with an arrow A in FIG. 6 is secured, with which efficient heat dissipation similar to the electronic device 10A can be realized.

Second Embodiment

Figure 7:
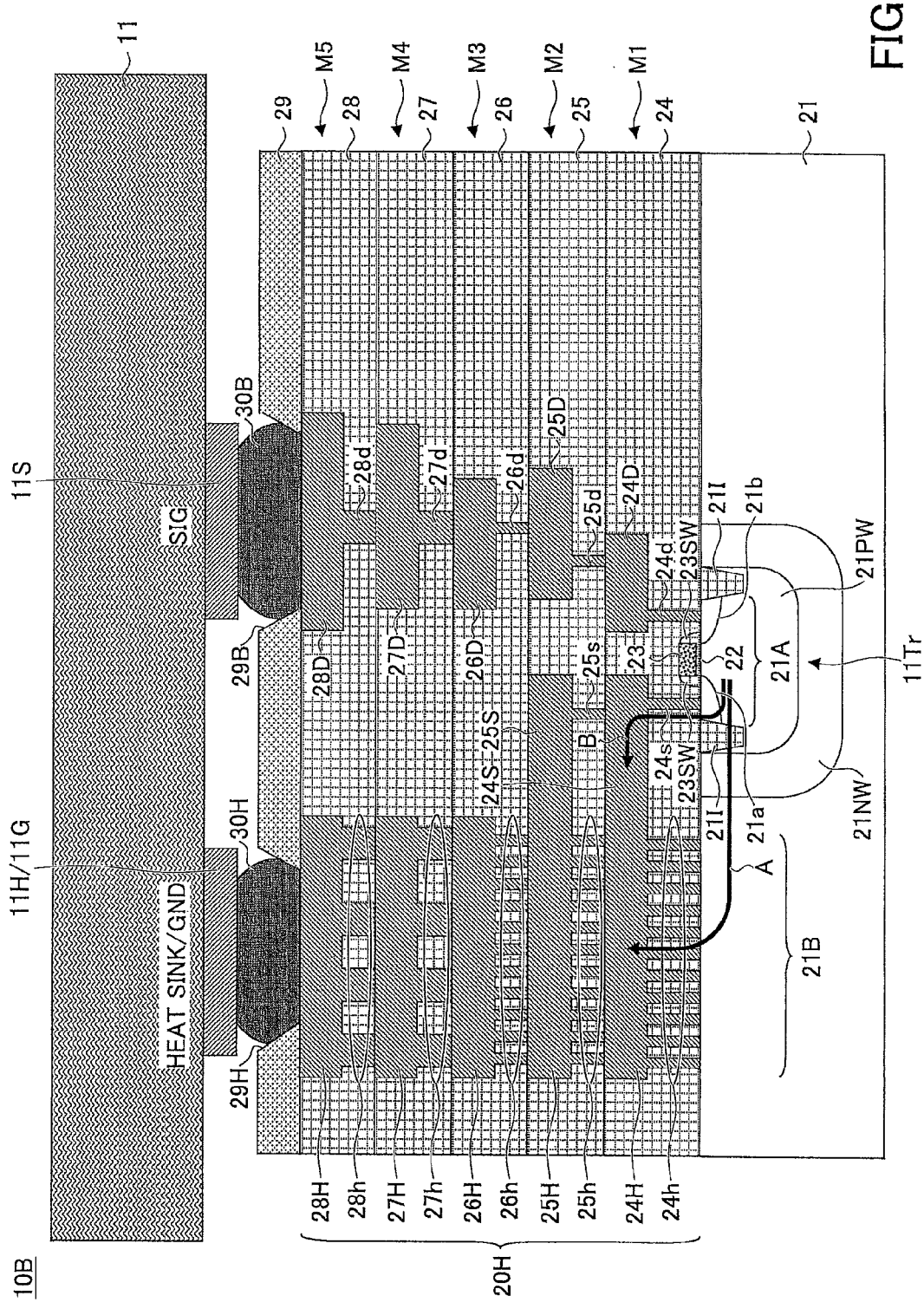
FIG. 7 is a cross-sectional view illustrating a configuration of an electronic device according to a second embodiment.

FIG. 7 is a cross-sectional view illustrating a configuration of an electronic device 10B according to a second embodiment. In FIG. 7, the same numerical codes are assigned to the parts described earlier, and their description is omitted.

Referring to FIG. 7, in the present embodiment, by connecting the source wiring patterns 24S-25S with the heat dissipation structure 20H, the source patterns 24S-28S and the via plugs 24s-28s grounded in the configuration in FIG. 1 are also used as a part of the heat dissipation structure 20H that is also grounded, which makes the area of the semiconductor chip smaller. With the above change, the wiring board 11 is also changed so that the ground pattern 11G and the conductor pattern 11H are unified into a conductor pattern 11H/11G, with which the Cu pad 28H is connected via the solder bump 30H. The source wiring patterns 26S-28S and the via plugs 26s-28s, which are independent from the heat dissipation structure 20H in FIG. 1, are omitted in the configuration in FIG. 7, and the solder bump 30A is also omitted.

It should be noted that in the configuration in FIG. 7, the source wiring pattern 24S that forms a part of the multi-layer wiring structure extends in the interlayer insulating film 24 to make connection with the Cu pad 24H in the same wiring layer M1, and the source wiring pattern 25S extends in the interlayer insulating film 25 to make connection with the Cu pad 25H in the same wiring layer M2. Configured in this way, heat generated at the transistor 11Tr conducts through not only the path designated with an arrow A in the semiconductor chip 21, but also a path through the via plug 24s and source pattern 24S designated with an arrow B, and moreover, a path along the via plug 25s and the source pattern 25S to the heat dissipation structure 20H, with which the electronic device 10B can perform efficient heat dissipation even though implementation with flip-chip mounting.

According to the present embodiment, as the heat dissipation structure 20H contacting directly with the semiconductor chip 21 is also used as the ground wiring pattern, there is likelihood in that noise in the semiconductor chip 21 mixes into the ground wiring pattern 11G in the wiring board 11. However, a practical problem may not arise because the transistor 11Tr is for very high-power output usage and the noise level in the semiconductor chip 21 is sufficiently smaller than the signal level.

Although any of the source wiring patterns 24S-28S in FIG. 1 may be used as a source wiring pattern that is connected with the heat dissipation structure 20H from an electrical viewpoint, it is preferable from a heat dissipation viewpoint to connect, for example, the source wiring patterns 24S and 25S, which are at the lowermost and a low layer close to it, with the heat dissipation structure 20H to rapidly conduct heat to the heat dissipation structure 20H that has low thermal resistance.

According to the present embodiment, although the heat dissipation structure 20H constitutes a part of ground wiring for a high-frequency circuit as above, degradation of an electrical characteristic that could be caused by stray capacitance can be effectively avoided in the electronic device 10B because stray capacitance is not generated between the Cu pad 24H and the p-type semiconductor chip 21 as the Cu pad 24H at the lowest layer is directly and densely connected with the surface of the semiconductor chip 21 through the Cu via plugs 24h.

Figure 8:
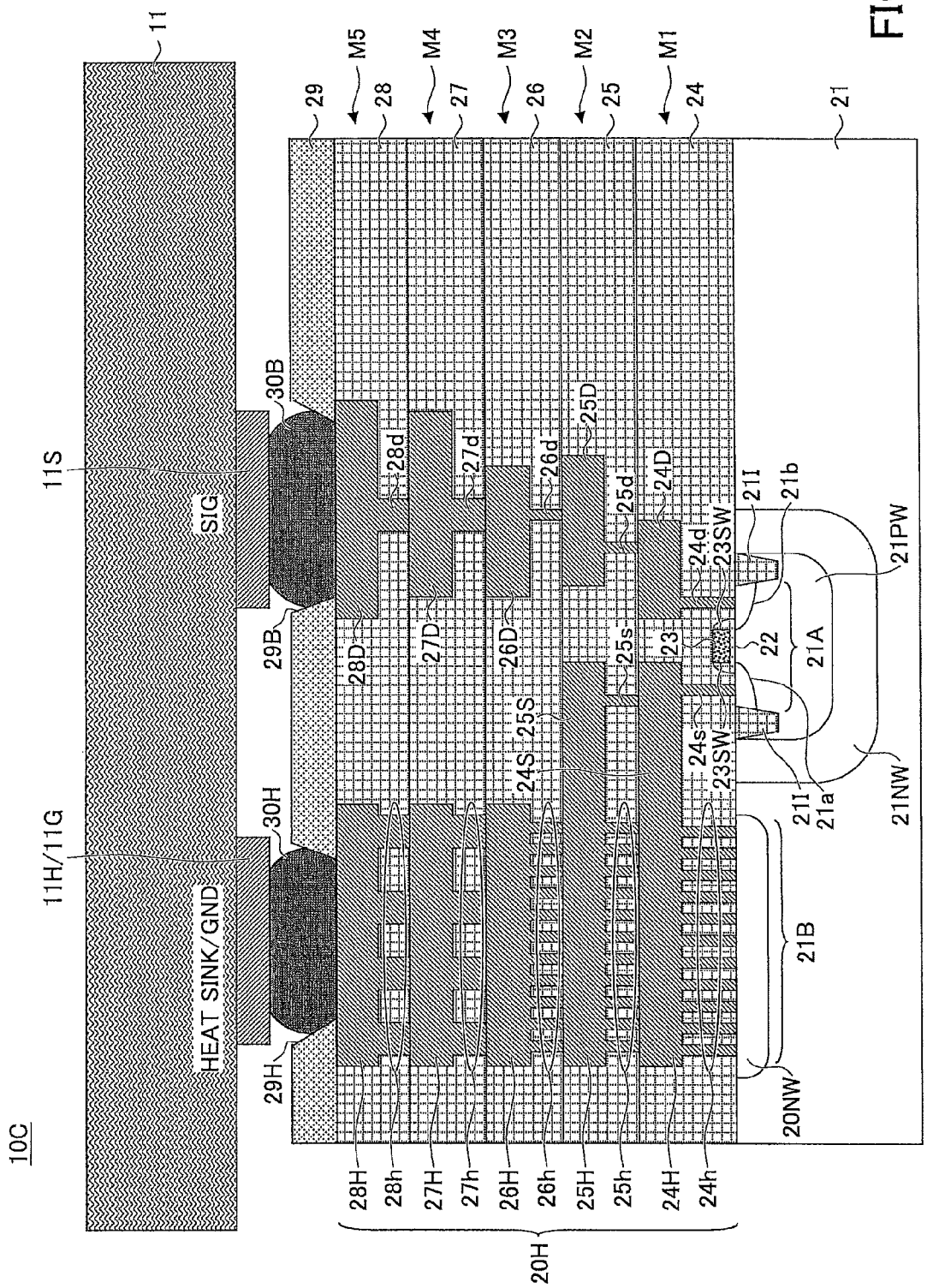
FIG. 8 is a cross-sectional view illustrating a modified example of the electronic device in FIG. 7.

FIG. 8 is a cross-sectional view illustrating an electronic device 10C according to a modified example of the electronic device 10B in FIG. 7. In FIG. 8, the same numerical codes are assigned to the parts described earlier, and their description is omitted.

Referring to FIG. 8, according to the modified example, an n-type well 20NW is formed in a region 21B on the surface of the semiconductor chip 21. A double well structure is formed with the p-type semiconductor chip 21 and the n-type well 20NW, on which the heat dissipation structure 20H is formed as described earlier. According to the modified example, a depletion layer accompanying the double well structure electrically separates the n-type well 20NW from the semiconductor chip 21, which makes it possible to prevent noise that propagates in the semiconductor chip 21 from mixing in the heat dissipation structure 20H to have an influence on a signal processing system on the wiring board 11.

Figure 9:
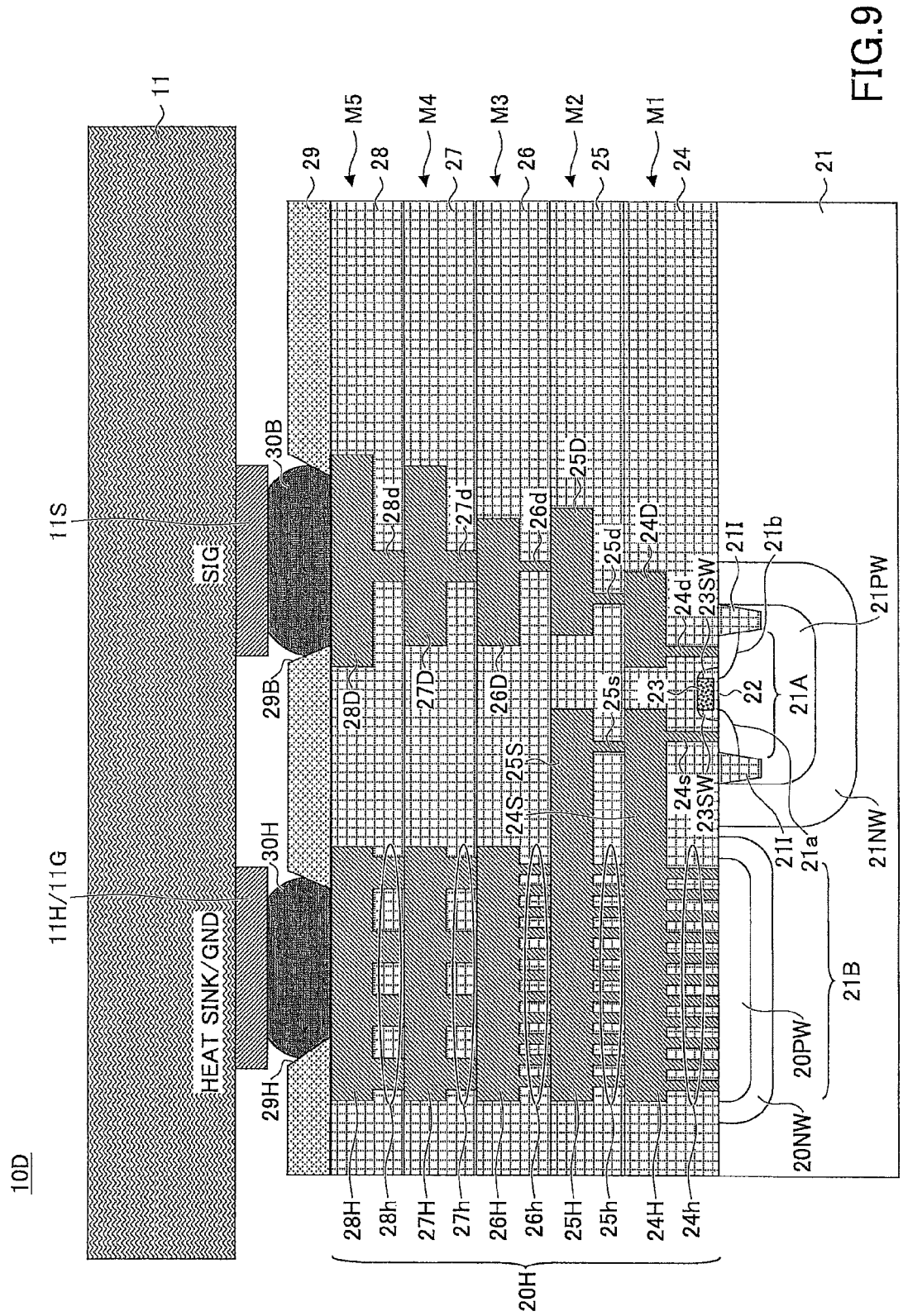
FIG. 9 is a cross-sectional view illustrating another modified example of the electronic device in FIG. 7.

FIG. 9 is a cross-sectional view illustrating another electronic device 10D according to a modified example of the electronic device 10C in FIG. 8. In FIG. 9, the same numerical codes are assigned to the parts described earlier, and their description is omitted.

Referring to FIG. 9, according to the modified example a p-type well 20PW is formed in the n-type well 20NW. A triple well structure is formed with the p-type semiconductor chip 21, the n-type well 20NW, and the p-type well 20PW, on which the heat dissipation structure 20H is formed as described earlier. According to the modified example, a depletion layer accompanying the triple well structure electrically separates the n-type well 20NW from the semiconductor chip 21, which make it possible to prevent noise that propagates in the semiconductor chip 21 from mixing into the heat dissipation structure 20H to have an influence on a signal processing system on the wiring board 11.

Figure 10:
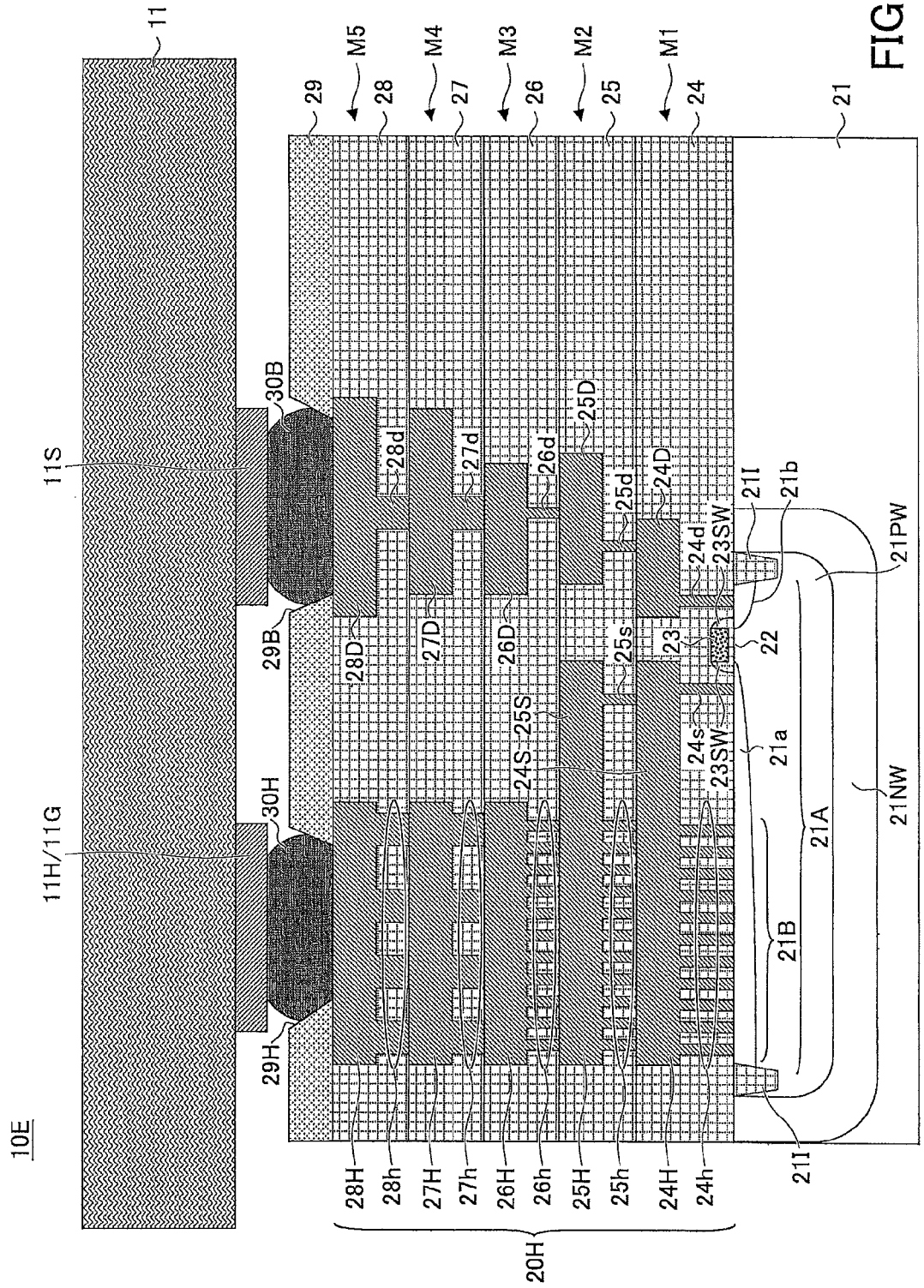
FIG. 10 is a cross-sectional view illustrating a configuration of an electronic device according to another modified example of the electronic device in FIG. 7.

FIG. 10 is a cross-sectional view illustrating an electronic device 10E according to another modified example of the electronic device 10B in FIG. 7, in which the source region 21a is extended to directly come into contact with the heat dissipation structure 20H. The n-type well 21NW and p-type well 21PW are also extended to be compatible with the wells 21NW-21PW in the configuration in FIG. 7.

With this configuration, cooling efficiency is further improved because heat is directly dissipated from the source region 21a via the heat dissipation structure 20H.

Third Embodiment

Figure 11C:
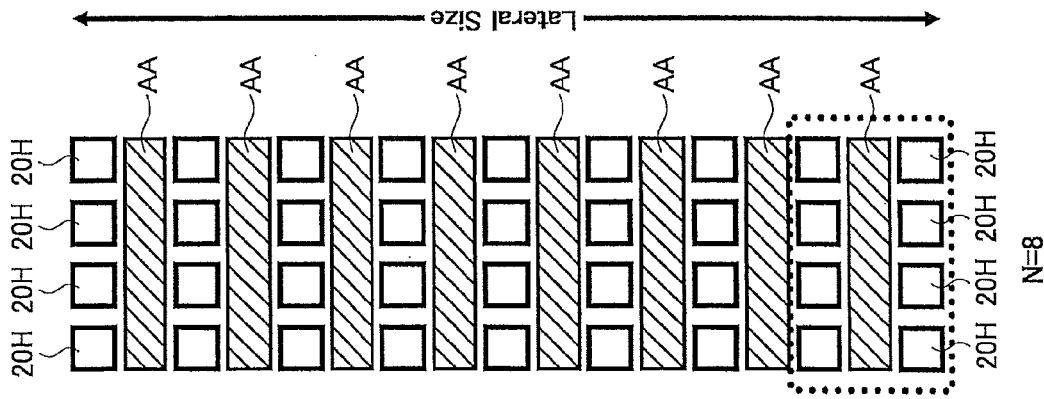
FIGS. 11A-11C are plan views illustrating various configurations of a power amplifier according to a third embodiment.
Figure 11B:
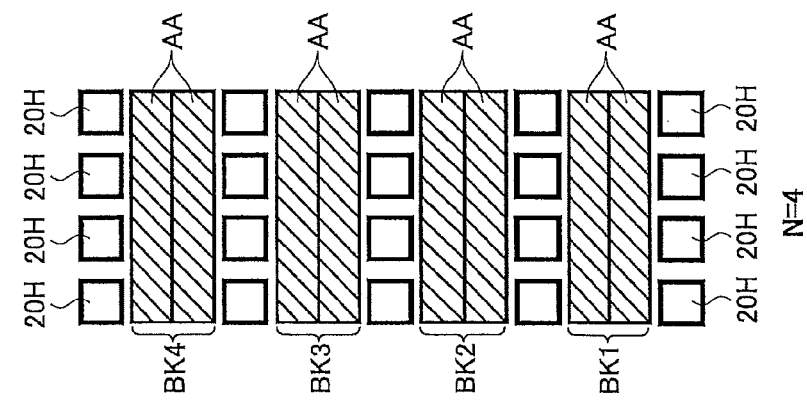
Figure 11A:
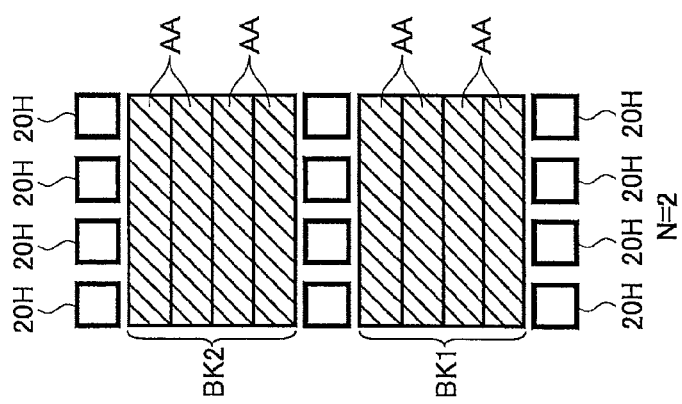

FIGS. 11A-11C are plan views illustrating various configurations of a power amplifier according to a third embodiment.

Referring to FIG. 11A, the power amplifier has a configuration, for example, in which a polysilicon gate electrode whose total gate width is 10 mm is bi-partitioned into a block BK1 with the gate width of 5 mm and a block BK2 with the same gate width of 5 mm, and the blocks BK1 and BK2 have four amp arrays AA, respectively. Each of the amp arrays AA includes 14 MOS transistors Tr1-Tr14 whose layout is illustrated in FIG. 12 in plan view (N=2).

Referring to FIG. 11B, the power amplifier has an alternative configuration, for example, in which a polysilicon gate electrode whose total gate width is 10 mm is partitioned into four blocks BK1-BK4 that have two amp arrays AA, respectively. Each of the amp arrays AA includes 14 MOS transistors Tr1-Tr14 whose layout is illustrated in FIG. 12 in plan view (N=4).

Referring to FIG. 11C, the power amplifier has an alternative configuration, for example, in which a polysilicon gate electrode whose total gate width is 10 mm is partitioned into eight blocks BK1-BK8 that have an amp arrays AA, respectively. Each of the amp arrays AA includes 14 MOS transistors Tr1-Tr14 whose layout is illustrated in FIG. 12 in plan view (N=8).

Figure 12:
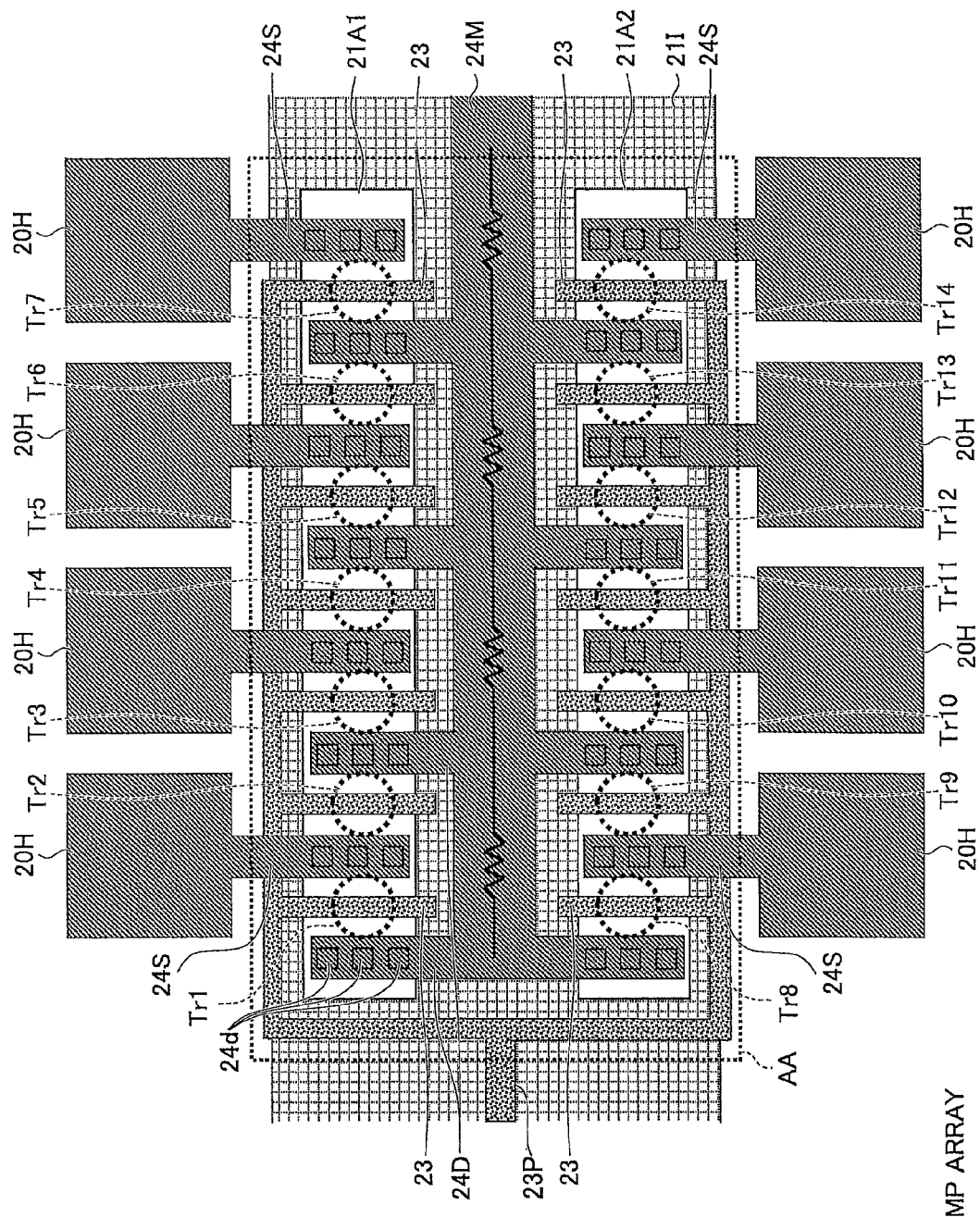
FIG. 12 is a schematic view illustrating a configuration of an amp array illustrated in FIG. 11.

In the configuration in FIG. 11A, the heat dissipation structures 20H described with FIGS. 7-9 are formed between the block BK1 and the block BK2, at a side surface of the block BK1 opposite to the block BK2, and at a side surface of the block BK2 opposite to the block BK1, and each of the heat dissipation structures 20H is electrically and thermally connected with the source wiring pattern 24D of a corresponding MOS transistor as illustrated in FIG. 12.

Referring to FIG. 12, a silicon dioxide film region for constituting an STI-type element isolating region 21I is formed with a band shape on the semiconductor chip 21, in which element forming regions 21A1 and 21A2 are formed in parallel with each other that correspond to the element forming region 21A.

Moreover, a polysilicon pattern 23P having a comb-like shape with a number of teeth is formed on the semiconductor chip 21. Each tooth of the polysilicon pattern 23P forms a gate electrode 23, and MOS transistors Tr1-Tr14 are formed at every position where each of the teeth crosses the element forming region 21A1 or 21A2.

On the semiconductor chip 21, a drain wiring pattern 24M having another comb-like shape is further formed at a wiring layer upper than the polysilicon pattern 23P, for example, at the wiring layer M1, which extends its teeth to cross the element forming region 21A1 or 21A2 from one side that is closer to the tips of the polysilicon pattern 23P, and each of the teeth of the drain wiring pattern 24M is connected with the drain region of the element forming region 21A1 or 21A2 through the via plugs 24d to form the drain wiring pattern 24D.

On the semiconductor chip 21, source wiring patterns 24S are further formed at a wiring layer upper than the polysilicon pattern 23P, for example, at the wiring layer M1 or M2, which extend their projections to cross the element forming region 21A1 or 21A2 from another side that is away from the tips of the polysilicon pattern 23P, and each of the source wiring patterns 24S is connected with the corresponding heat dissipation structure 20H.

Configured in this way, heat generated at transistors Tr1-Tr14 is conducted from the source wiring patterns 24S to the corresponding heat dissipation structures 20H, respectively, to avoid an excessive temperature rise of the semiconductor chip 21. According to the present embodiment, the heat dissipation structure 20H has superior heat dissipation efficiency because the heat dissipation structure 20H is formed to directly make contact with the surface of the semiconductor chip 21. Therefore, heat dissipation structures 20H are not necessarily formed for each amp array AA as illustrated in FIG. 11C, but may be formed for a block such as a block BK1-BK2 or BK1-BK4 that includes multiple amp arrays AA as illustrated in FIG. 11A or 11B, to reduce the size of the power amplifier on the semiconductor chip 21.

Fourth Embodiment

Figure 13:
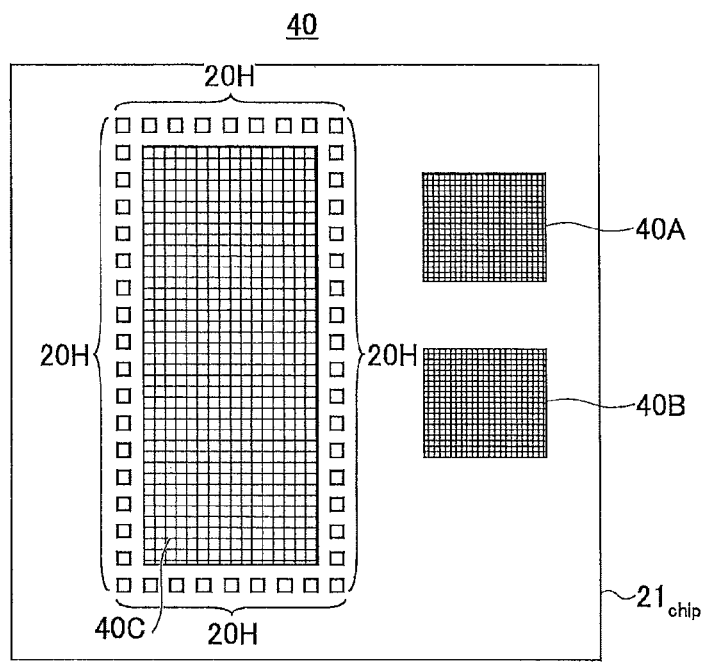
FIG. 13 is a plan view illustrating a semiconductor integrated circuit device according to a fourth embodiment.

FIG. 13 is a plan view illustrating a semiconductor integrated circuit device 40 that integrates a power amplifier configured with electronic devices as described in the embodiments illustrated in FIGS. 7-9 along with peripheral circuit devices on a semiconductor chip $21_{chip}$ that realized the semiconductor chip 21.

Figure 14:
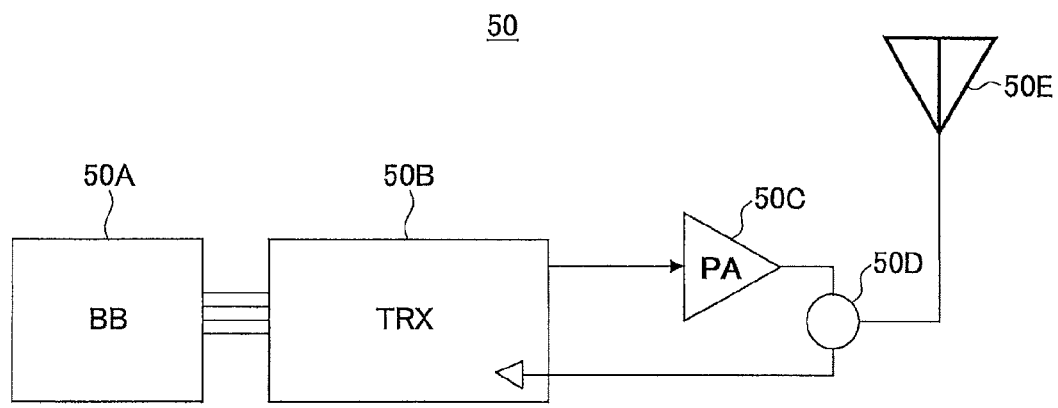
FIG. 14 is a block diagram of a wireless device corresponding to the semiconductor integrated circuit device in FIG. 13.

The semiconductor integrated circuit device 40 is used, for example, for configuring a wireless device 50 whose block diagram is illustrated in FIG. 14. The wireless device 50 includes a baseband circuit (BB) 50A, a transceiver (TRX) 50B, a power amplifier (PA) 50C, and a duplexer 50D. In the wireless device 50, a baseband signal generated at the baseband circuit 50A is converted into a high-frequency signal in a GHz band by the transceiver 50B, which is amplified by the power amplifier 50C, then sent to an antenna 50E via the duplexer 50D as a high-power, high-frequency signal. Conversely, a weak high-frequency signal received at the antenna 50E is sent to the transceiver 50B via the duplexer 50D, which is converted into a baseband signal, then sent to the baseband circuit 50A.

Referring to the plan view in FIG. 13, a baseband circuit unit 40A, a transceiver unit 40B, and a power amplifier unit 40C are formed on the semiconductor chip $21_{chip}$ that correspond to the baseband circuit 50A, the transceiver 50B, and the power amplifier 50C in FIG. 14, respectively. A number of heat dissipation structures 20H described earlier are formed around the power amplifier unit 40C.

In the semiconductor integrated circuit device 40 configured as above, heat generated at the power amplifier unit 40C is efficiently conducted to a wiring board (not illustrated) on which the semiconductor integrated circuit device 40 is flip-chip mounted, to suppress a temperature rise of the semiconductor chip $21_{chip}$. As described earlier, in the configuration in FIG. 13, a number of heat dissipation structures 20H are formed that enclose the power amplifier unit 40C. Therefore, a part of the heat dissipation structures 20H surely exist between the power amplifier unit 40C and the peripheral circuit units such as the baseband circuit unit 40A, the transceiver unit 40B, and the like, which prevent heat generated at the power amplifier 40C from conducting to these peripheral circuit units that operate at lower frequencies; hence an adverse influence induced by head conduction, such as a malfunction, can be avoided.

It is noted that the heat dissipation structures 20H described in the above embodiments can be applied to not only wireless devices such as cellular phones, but also various large-scale semiconductor integrated circuit devices that are flip-chip mounted, such as processors (CPUs) for supercomputers, and moreover, what is called 3D semiconductor devices in which large-scale semiconductor integrated circuit devices are stacked.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a semiconductor substrate;
an active element configured to be formed on the semiconductor substrate; and
a multi-layer wiring structure configured to be formed on the semiconductor substrate;
wherein a heat dissipation structure is provided in the multi-layer wiring structure, an upper end of the heat dissipation structure forms an external connection pad to be connected with an external wiring board, and a lower end of the heat dissipation structure makes contact with a surface of the semiconductor substrate outside of an element forming region for the active element,
wherein the multi-layer wiring structure includes a plurality of interlayer insulating films stacked one over another and a plurality of wiring layers, each of the wiring layers includes both a pad and a plurality of via plugs extending downwards from the wiring layer pad as part of the heat dissipation structure making the contact outside the element forming region, and the plurality of via plugs of each of the wiring layers are arranged in a two-dimensional matrix form in a plan view, and
wherein the pad of each of the wiring layers has a plurality of openings formed therethrough, and the openings of the pad in a given one of the wiring layers are situated directly above the openings of the pad in another one of the wiring layers.

2. The semiconductor device as claimed in claim 1, wherein the heat dissipation structure is configured with the pads and the via plugs formed in the interlayer insulating films,
in the heat dissipation structure, the via plugs in each of the interlayer insulating films except for the interlayer insulating film at a lowest layer make contact with the pad of the underlying interlayer insulating film, and
the via plugs in the interlayer insulating film at the lowest layer in the heat dissipation structure make contact with the surface of the semiconductor substrate as the lower end of the heat dissipation structure.

3. The semiconductor device as claimed in claim 1, wherein the pad in each of the interlayer insulating films is formed right above the pad of the underlying interlayer insulating film, in the heat dissipation structure.

4. The semiconductor device as claimed in claim 1, wherein the element forming region is separately formed on the semiconductor substrate bounded by an element isolating region,
wherein the lower end of the heat dissipation structure makes contact with the surface of the semiconductor substrate in a region outside of the element forming region and the element isolating region.

5. The semiconductor device as claimed in claim 1, wherein the active element includes a diffusion region configured to function as a ground node, and the lower end of the heat dissipation structure is electrically connected with the diffusion region.

6. The semiconductor device as claimed in claim 5, wherein the diffusion region is electrically connected with the multi-layer wiring structure via the heat dissipation structure.

7. The semiconductor device as claimed in claim 5, wherein the active element is a MOS transistor, and the diffusion region is a source diffusion region of the MOS transistor.

8. The semiconductor device as claimed in claim 5, wherein a well having a conductivity type opposite to a conductivity type of the semiconductor substrate is formed on the surface of the semiconductor substrate being contacted with the lower end of the heat dissipation structure.

9. The semiconductor device as claimed in claim 5, wherein a first well having a conductivity type opposite to a conductivity type of the semiconductor substrate is formed on the surface of the semiconductor substrate,
   a second well having the same conductivity type as the semiconductor substrate is formed inside of the first well, and
   the lower end of the heat dissipation structure makes contact with the second well.

10. The semiconductor device as claimed in claim 1, wherein the external connection pad formed by the upper end of the heat dissipation structure is connected with a conductor pattern on the external wiring board by a solder bump.

11. The semiconductor device as claimed in claim 1, wherein the openings are filled with a material of which the interlayer insulating films are made.

12. A semiconductor device comprising:
   a semiconductor substrate;
   an active element configured to be formed on the semiconductor substrate; and
   a multi-layer wiring structure configured to be formed on the semiconductor substrate;
   wherein the active element includes a diffusion region,
   a wiring layer in the multi-layer wiring structure is electrically connected with a first region in the diffusion region through a via plug,
   a heat dissipation structure is provided in the multi-layer wiring structure, an upper end of the heat dissipation structure forms an external connection pad to be connected with an external wiring board, and
   a lower end of the heat dissipation structure makes contact with a surface of the semiconductor substrate in a second region different from the first region,
   wherein the multi-layer wiring structure includes a plurality of interlayer insulating films stacked one over another and a plurality of wiring layers, each of the wiring layers includes both a pad and a plurality of via plugs extending downwards from the wiring layer pad as part of the heat dissipation structure making the contact in the second region different from the first region, and the plurality of via plugs of each of the wiring layers are arranged in a two-dimensional matrix form in a plan view, and
   wherein the pad of each of the wiring layers has a plurality of openings formed therethrough, and the openings of the pad in a given one of the wiring layers are situated directly above the openings of the pad in another one of the wiring layers.

13. The semiconductor device as claimed in claim 12, wherein the openings are filled with a material of which the interlayer insulating films are made.

14. A semiconductor integrated circuit device comprising:
   a semiconductor substrate;
   a first function block configured to be formed on a first element forming region on the semiconductor substrate, and to include a first semiconductor element operating at a first frequency;
   a second function block configured to be formed on a second element forming region on the semiconductor substrate, and to include a second semiconductor element operating at a second frequency lower than the first frequency; and
   a multi-layer wiring structure configured to be formed on the semiconductor substrate;
   wherein a plurality of interlayer insulating films are stacked one after another in the multi-layer wiring structure,
   the interlayer insulating films include a plurality of wiring layers, respectively,
   a plurality of heat dissipation structures are formed in the multi-layer wiring structure around the first function block, and contact the surface of the semiconductor substrate,
   each of the heat dissipation structures includes a plurality of pad regions and a plurality of via plugs extending downwards from the respective pad regions, one of the pad regions being formed as a part of the corresponding wiring layer in one of the interlayer insulating films, the pad regions being stacked one after another from the interlayer insulating film at a lowest layer to the interlayer insulating film at an uppermost layer,
   the via plugs in each of the interlayer insulating films except for the interlayer insulating film at the lowest layer make contact with the pad region of the underlying interlayer insulating film, and
   the via plugs in the interlayer insulating film at the lowest layer make contact with the surface of the semiconductor substrate outside of the first element forming region, and
   the plurality of via plugs of each of the wiring layers are arranged in a two-dimensional matrix form in a plan view,
   wherein the pad of each of the wiring layers has a plurality of openings formed therethrough, and the openings of the pad in a given one of the wiring layers are situated directly above the openings of the pad in another one of the wiring layers.

15. The semiconductor integrated circuit device as claimed in claim 14, wherein at least one of the heat dissipation structures is disposed between the first function block and the second function block on the semiconductor substrate.

16. The semiconductor integrated circuit device as claimed in claim 14, wherein at least one of the heat dissipation structures is electrically connected with a diffusion region constituting a ground node of the first semiconductor element by the multi-layer wiring structure.

17. The semiconductor integrated circuit device as claimed in claim 14, wherein the first semiconductor element is used for configuring a high-frequency amplifier in the first function block.

18. An electronic device comprising:
   a wiring board; and
   a semiconductor chip configured to be mounted on the wiring board by flip-chip mounting, wherein the semiconductor chip includes the semiconductor integrated circuit device as claimed in claim 14, and the heat dissipation structure is connected with a ground pattern on the wiring board via a solder bump.

19. The electronic device as claimed in claim 18, wherein the ground pattern on the wiring board is provided separately from a ground pattern constituting a part of a signal transmission system on the wiring board.

* * * * *